US006897470B2

(12) United States Patent
Herr et al.

(10) Patent No.: US 6,897,470 B2
(45) Date of Patent: *May 24, 2005

(54) SUPERMOLECULAR STRUCTURES AND DEVICES MADE FROM SAME

(75) Inventors: Daniel Joseph Christian Herr, Chapel Hill, NC (US); Victor Vladimirovich Zhirnov, Raleigh, NC (US)

(73) Assignees: Semiconductor Research Corporation, Durham, NC (US); North Carolina State University, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/685,041

(22) Filed: Oct. 14, 2003

(65) Prior Publication Data

US 2005/0062036 A1 Mar. 24, 2005

Related U.S. Application Data

(63) Continuation of application No. 09/510,802, filed on Feb. 23, 2000, now Pat. No. 6,664,559.

(51) Int. Cl.[7] .............................................. H01L 29/06
(52) U.S. Cl. .............................. 257/14; 257/17; 257/22; 257/197
(58) Field of Search .............................. 257/14, 17, 22, 257/197

(56) References Cited

U.S. PATENT DOCUMENTS

| 5,981,316 A | 11/1999 | Yamada et al. ............. 438/128 |
| 6,068,698 A | 5/2000 | Schmidt |
| 6,525,336 B1 * | 2/2003 | Kondo et al. .................. 257/14 |

FOREIGN PATENT DOCUMENTS

| EP | 0 781 727 A1 | 2/1997 |
| WO | WO 99/13511 A2 | 3/1999 |

OTHER PUBLICATIONS

D. M. Eigler et al., "Postioning single atoms with a scanning tunnelling microscope", Nature, vol. 344 (Apr. 1990) pp 524–526.

P. Bedrossian et al., "Demonstration of the tunnel–diode effect on an atomic", scale, Nature, vol. 342 (Nov. 1989) pp 258–260.

Deiraju, G.R. (Ed.), Thoughts on Crystals as Supramolecules, The Crystal as a Supermolecular Entity, John Wiley and Sons Ltd., 1996.

Feynman, R.P. Infinitesimal Machinery, Journal of Micro-Mechanical Systems, vol. 2, No. 1, Mar. 1993, pp. 4–14.

Feynman, R.P., There's Plenty of Room at the Bottom, Engineering and Science, vol. 23, 1960, pp. 22–36, Reprinted in Anthony J.G. Hey (Ed.), Feynman and Computation: Exploring the Limits of Computers, Perseus Books, 1999.

(Continued)

Primary Examiner—Jerome Jackson
(74) Attorney, Agent, or Firm—Moore & Van Allen PLLC; Steven B. Phillips

(57) ABSTRACT

Supermolecular structures and devices made from same. Semiconductor materials and devices are manufactured and provided which use controlled, discrete distribution of and positioning of single impurity atoms or molecules within a host matrix to take advantage of single charge effects. Single-dopant pn junctions and single-dopant bipolar cells are created. Each bipolar cell can function as a bistable device or an oscillator, depending on operating temperature. The cells can be used alone or in an array to make useful devices by adding an insulating substrate and contact electrodes.

5 Claims, 14 Drawing Sheets

OTHER PUBLICATIONS

Giro, et al., *Single Layer Electroluminescent Devices Based on Molecularly Doped Polymer (MDP) 3Films*, Synthetic Metals, vol. 84, 1997, pp. 379–380.

Johnson, et al., *Electroluminescence From Single Layer Molecularly Doped Polymer Films*, SPIE, vol. 1910, 1993, pp. 6–14.

Metzger, R.M., *Electrical Rectification by a Molecule: The Advent of Unimolecular Electronic Devices*, Accounts of Chemical Research, vol. 32, No. 11, 1999, pp. 950–957.

Nikzad, et al., *Direct Detection and Imaging of Low–Energy Electrons With Delta–Doped Charge–Coupled Devices*, Applied Physics Letters, vol. 73, No. 23, Dec. 7, 1998, pp. 3417–3419.

Stormer, et al., *GaAs Field–Effect Transistor With An Atomically Precise Ultrashort Gate*, Appl. Phys. Lett., vol. 59, No. 9, Aug. 26, 1991, pp. 1111–1113.

Tucker, et al., *Prospects for Atomically Ordered Device Structures Based on STM Lithography*, Solid–State Electronics, vol. 42, No. 7–8, 1998, pp. 1061–1067.

Zaknoune, et al., *High–Power V–Band $Ga_{a53}In_9P/In_{a2}Ga_{a8}As$ Pseudomorphic HEMT Grown by Gas Source Molecular Beam Epitaxy*, IEEE Microwave and Guided Wave Letters, vol. 9, No. 1, Jan. 1999, pp. 28–30.

Saito, S. et al., "Electronic Structure of $Si_{29}$ and $C_{29}$ Fullerides," *Proceedings of the Symposium on Recent Advances in the Chemistry and Physics of Fullarenes and Related Materials*, vol. 3, pp. 457–461, 1996.

Cavin, R. et al., "Semiconductor research needs in the nanoscale physical sciences: a Semiconductor Research Corporation working paper," *Journal of Nanoparticle Research 2*; pp. 213–235; 2000.

Ozin, Geoffrey A.; "Nanochemistry: Synthesis in Diminishing Dimensions," *Advanced Materials* 4, *No.* 10: pp. 612–649; 1992.

* cited by examiner $\phi_B = \phi(E_g, E_{Fd}, E_{F2})$
$= \phi(E_g, N_d, N_2)$ $N-1 \approx N \approx N+1$

| L, nm | Number of Si atoms | Sigle-dopant concentration, cm$^{-3}$ | Equivalent resistivity, $\Omega$-cm |
|---|---|---|---|
| 100 | 50,000,000 | 1E+15 | 5.00 |
| 50 | 6,250,000 | 8E+15 | 2.00 |
| 10 | 50,000 | 1E+18 | 0.04 |
| 5 | 6,250 | 8E+18 | 0.01 |

FIG. 10

$$\Delta V_1 = (e/\pi \varepsilon_0 \varepsilon) L^{-1}$$

$$\Delta V_2 = (e/2\pi \varepsilon_0 \varepsilon) L^{-1}$$

$$\Delta V_2 = \frac{1}{2} \Delta V_1$$

$$kT_{th} \sim \Delta V_2$$

$$T_{th} \sim \Delta V_2 / k$$

– Thermal Threshold

| L, nm | $\Delta V_1$ Volts | $\Delta V_2$ Volts | $T_{th}$, K |
|---|---|---|---|
| 100 | 0.012 | 0.006 | 50 |
| 50 | 0.023 | 0.012 | 100 |
| 40 | 0.030 | 0.015 | 150 |
| 30 | 0.040 | 0.020 | 200 |
| 20 | 0.060 | 0.030 | 300 |
| 10 | 0.120 | 0.060 | 600 |
| 5 | 0.230 | 0.120 | 1200 |

FIG. 11

| L, nm | ΔV₁ Volts | ΔV₂ Volts | $T_{th}$, K | τ, S | f, GHz | Power/cell, W | Power/cm², W/cm² | Power/1D-array W/cm |
|---|---|---|---|---|---|---|---|---|
| 100 | 0.012 | 0.006 | 50 | 3.14E-10 | 3.18 | 5.86E-12 | 0.0586 | 2.93E-07 |
| 50 | 0.023 | 0.012 | 100 | 1.11E-10 | 8.99 | 3.31E-11 | 1.33 | 3.31E-06 |
| 40 | 0.03 | 0.015 | 150 | 7.96E-11 | 12.6 | 5.79E-11 | 3.62 | 7.24E-06 |
| 30 | 0.04 | 0.020 | 200 | 5.17E-11 | 19.4 | 1.19E-10 | 13.2 | 1.98E-05 |
| 20 | 0.06 | 0.030 | 300 | 2.81E-11 | 35.6 | 3.28E-10 | 81.9 | 8.19E-05 |
| 10 | 0.12 | 0.060 | 600 | 9.94E-12 | 101 | 1.85E-09 | 1850.0 | 9.26E-04 |
| 5 | 0.23 | 0.120 | 1200 | 3.52E-12 | 284 | 1.05E-08 | 41900.0 | 1.05E-02 |

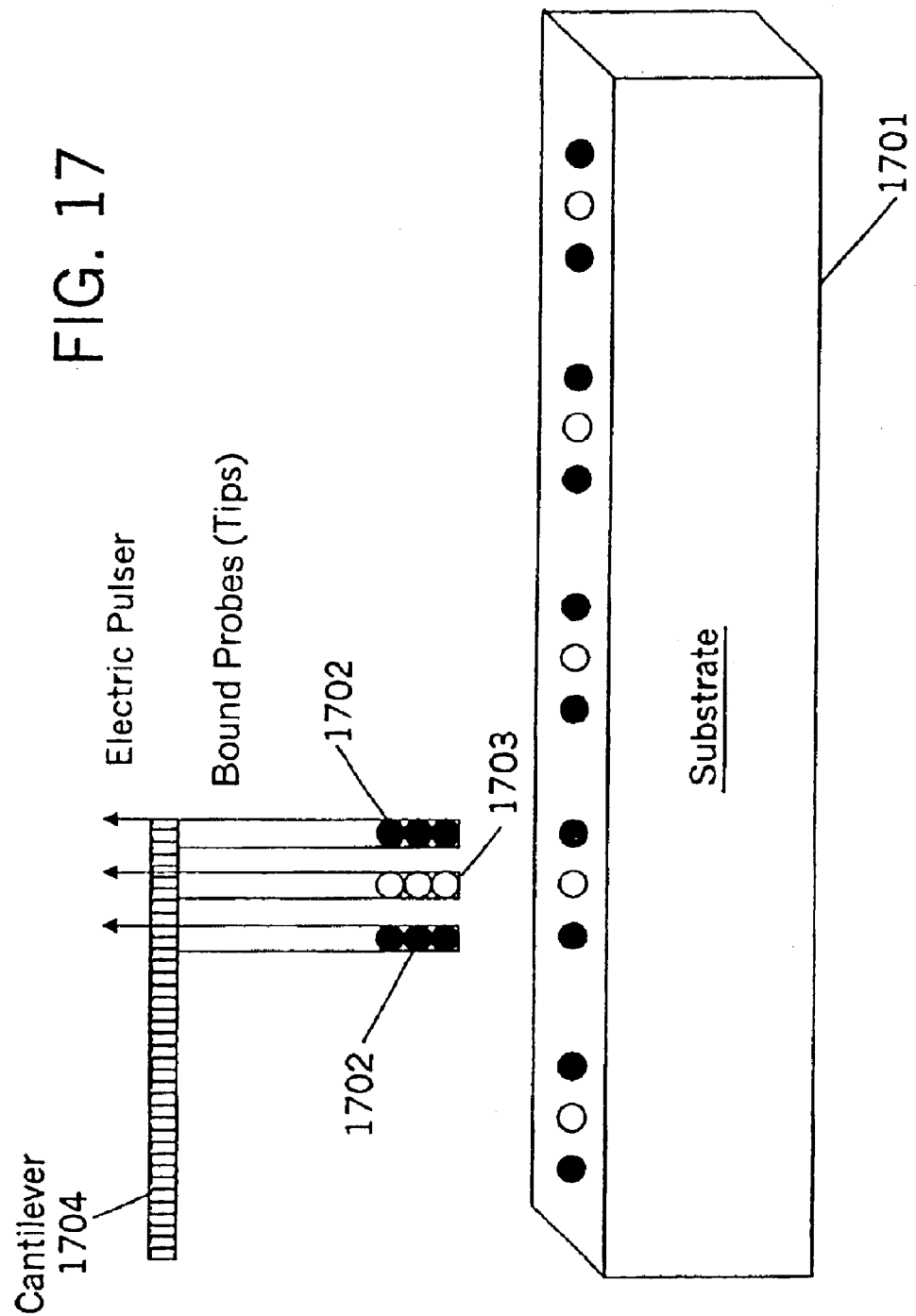

1801

1802

1803

1901

1902

1903

1904

SUPERMOLECULAR STRUCTURES AND DEVICES MADE FROM SAME

CROSS REFERENCE TO RELATED APPLICATION

This application is a continuation of and claims priority from commonly, co-pending patent application Ser. No. 09/510,802, filed Feb. 23, 2000, U.S. Pat. No. 6,664,559 entire disclosure of which is incorporated herein by reference.

BACKGROUND

1. Field of the Invention

This invention relates to supermolecular structures that are used to build semiconductor devices. More specifically, this invention relates to structures and devices based on the controlled discrete distribution and arrangement of single impurity dopant atoms or molecules within a lattice or amorphous matrix. The controlled arrangement of dopants in a semiconductor matrix provides structures that exhibit very beneficial characteristics by engineering single-charge effects. The invention also relates to methods of manufacturing such structures and devices.

2. Description of the Problem

There exists a need for the ability to control and order the distribution and effect of impurities, eg. dopant atoms, in a lattice or semiconductor matrix. Such an ability would open new opportunities to making 'smart' nanoelectronic structures. Today's semiconductor based microelectronics relies on device structures with stochastic distributions of dopants. Conventional doping is treated as a macroscopic phenomenon, as it adds large numbers of atoms to semiconductor materials. It would be advantageous to develop structures that represented the ultimate limits of doping and host material control.

For large numbers of atoms, the typical behavior and distribution of these atoms is governed by Boltzman or Fermi-Dirac statistics. From this stochastic perspective, doping effects a shift of Fermi level states. These states are dependent on temperature, dopant concentration, and semiconductor band gap. FIG. 1 illustrates pn-junction barrier height as a function of band gap and Fermi level position. The Fermi level position corresponds to a dopant concentration. In this macroscopic case, the addition or subtraction of one to a few extra dopant atoms or electrons to the system does not induce a significant change to the potential distribution. In FIG. 1, NB is the potential barrier height in a pn-junction, $E_g$ is semiconductor band gap, $E_{Fd}$ and $E_{Fa}$ are Fermi levels in respectively acceptor-doped and donor-doped parts of semiconductor, $N_a$, $N_d$ are volume concentrations of acceptors and donors, respectively, such that, $N_B = E_g - (E_{Fn} + E_{FP})$. For a complete discussion of doping effects, see the book by S. M. Sze, *Physics of Semiconductor Devices*, (1981, Johne Whiley & Sons, Inc.), which is incorporated herein by reference.

Conventional scaling of semiconductor devices to smaller and smaller sizes fundamentally will become limited by the macroscopic behavior described above. As devices become smaller and smaller, the numbers of dopant atoms in a device or region of interest also continues to decrease. At some point, the number of dopants in the active areas become so small that performance will be dominated by small number effects and will no longer be controlled sufficiently by the stochastic distributions of dopants. Using conventional semiconductor manufacturing methods in this small number domain, the properties of the device become unpredictable and uncontrollable. It would be desirable to tightly control the distribution and placement of dopant atoms in a material by atomic level engineering, such that the behavior of the material can be predicted by leveraging single charge effects.

SUMMARY

The present invention solves the above-described problem by providing materials and devices based on the creation of a supermolecular, semiconducting structure. This structure results from the controlled discrete distribution of, and arrangement of, single-impurity atoms or molecules within a host matrix, rather than on a stochastic distribution of dopants in a continuum or lattice environment. The general principle of operation is based on-single charge effects, when considerable change in the potential in a system occurs due to addition, or modification, of a single charge.

The invention provides a supermolecular structure made up of a host material with controlled impurities. The positions of the component atoms in the structure are fixed and controlled to impart predictable properties to the structure. The structure can be described by the empirical formula $H_A \Sigma X_{i_a}$ where H defines the host material, A is a number representing the number of host atoms in the structure, X defines the $i^{th}$ impurity, and a defines the quantity of the $i^{th}$ impurity. The structure defined by this formula can be used to form a pn junction or a bipolar cell.

With the present invention, a single-dopant pn junction is created by depositing a single donor atom so that it resides at a first side of a host structure, and depositing a single acceptor atom at a second, opposing side. The single donor and acceptor atoms are positioned so that a single dipole is created within the host structure. A pn junction device can be made from a cell as described here by building the structure on a substrate and attaching contact electrodes.

As mentioned above, the invention also facilitates creation of a single-dopant bipolar cell. To form this bipolar cell, a pair of atoms, both either donor or acceptor atoms, resides at opposing sides of the host structure. A single atom is placed between the atoms of the pair. If the atoms in the pair are donors, the single atom is an acceptor. If the pair of atoms are acceptors, the single atom is a donor. The atoms are all positioned so that two asymmetrical potential wells, separated by a barrier, are formed within the semiconductor. The bipolar cell can be made into a stand-alone device by adding an insulating substrate and contact electrodes. This device can either function as a bistable device or an oscillator, depending on operating temperature, as will be discussed later.

The present invention also can be used to create an oscillator array from a plurality of electrostatically coupled bipolar cells. This array can be used to make a semiconductor oscillator since the array provides a means of generating coherent oscillations that will result if the array is maintained at a temperature equal to or greater than a threshold temperature. An oscillator device is made from the array built on an insulating substrate. Contact electrodes are connected to the array as a means of connecting the device to external circuitry, and a thermal energy supply system is included to maintain the proper operating temperature of the array. Oscillator arrays and/or oscillator devices as described above can be used to make energy converters, seemingly self-powered electrical devices, wireless interconnects, and a myriad of other devices.

Single-dopant cells according to the invention may be fabricated either horizontally or vertically. In the horizontal case, a single, three-atom set of dopants is placed on a semiconductor substrate. An epitaxial film of the semiconductor is grown over the three-atom set, and at least one, but usually several, insulating monolayers are passivated. Placing several three-atom sets of dopant atoms onto the substrate in the first step can make a plurality of horizontal cells. A pattern, which defines the shape of the cells, is produced at the surface of the epitaxial film.

In the vertical case, the three-atom set is formed vertically by placing a first atom of a first type on the substrate, growing a first epitaxial layer, placing a single atom of a second type on the first epitaxial layer and growing another epitaxial layer, and so on. The cell is again passivated at the end of the process. A plurality of vertical cells is fabricated by placing multiple first atoms of the first type, multiple single atoms of the second type, and multiple second atoms of the first type to form multiple, vertical three-atom sets. In the multiple cell fabrication process, patterns defining the shapes of the cells are produced at the top epitaxial layer.

BRIEF DESCRIPTION OF THE DRAWINGS

FIG. 10 is a table illustrating the relationship of various cell parameters to cell size.

FIG. 11 is a table illustrating the parameters of a single-dopant bipolar cell in oscillator mode.

FIG. 17 illustrates one possible fabrication setup which can be used to make devices according to the present invention.

DETAILED DESCRIPTION

General Principles of Operation

Figures 2, 3:
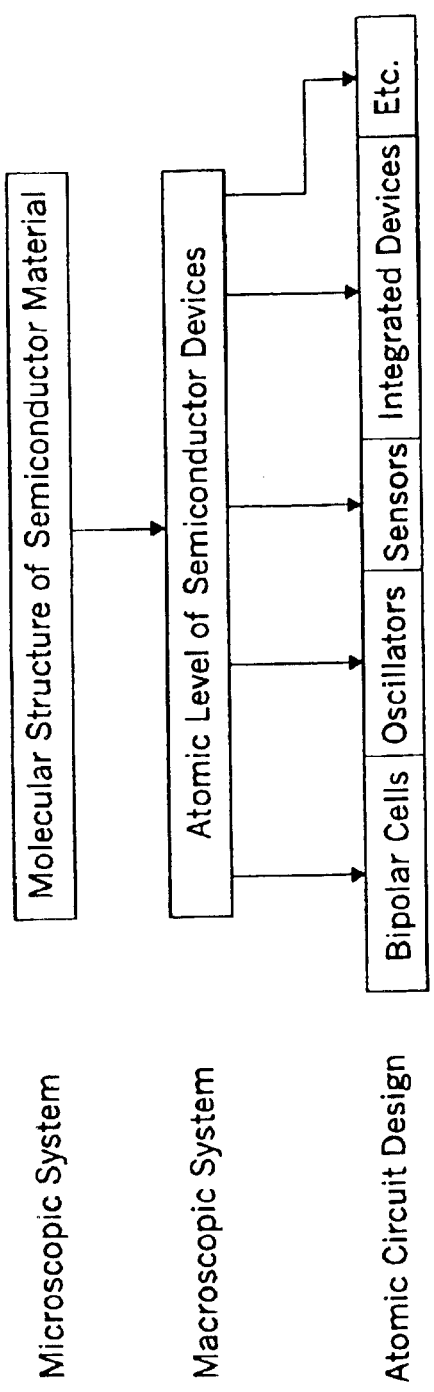
FIG. 2 illustrates design flow correlation between microscopic structural parameters and macroscopic properties according to the invention.
FIG. 3 is a table illustrating single-dopant parameters for sub-100 nm silicon structures.

The present invention encompasses the disciplines of chemistry and electronics and embodies devices based on atomistically engineered supermolecular semiconducting structures. FIG. 2 illustrates a hierarchy that summarizes the design flow that contributes to the correlation between microscopic structural parameters and macroscopic properties according to the invention. The structures of the invention exhibit unique properties due to either the single-charge effect, e.g. the large change in potential distribution in the system due to the addition, the removal, or displacement of a single charge; or the host effect, e.g. the influence of the local environment, including, but not limited to, factors such as materials selection, ambient temperature, etc. In many cases the structures take advantage of both of these effects. The host effect operates on potential surfaces and barriers near the dopants and donor-acceptor systems. These barriers can be designed to be symmetrical or asymmetrical, depending on device and system requirements. The host effect in turn affects kinetics mechanism(s) and trajectory of charge transfer.

Semiconducting, or related, structures containing only single dopants provide opportunities for new device structures and properties. For example, consider a silicon cube with dimensions 100 nm×100 nm×100 nm. The presence of only one dopant atom, such as phosphorus, in the cube results in a donor concentration of $1\times10^{15}$ cm$^{-3}$. The resistivity of bulk silicon at this doping level is approximately 5 $\Omega$-cm, which is low compared to $10^4$–$10^5$ $\Omega$-cm for very pure undoped silicon. For smaller cubes with dimensions=L [nm], the impact of single dopants on resistivity becomes even more pronounced. In this domain, effective doping concentrations increase and resistivities vary with decreasing device dimensions, as shown in FIG. 3. The definition of "single-electron" effects can be extended to single dopant and charge effects, which do not necessarily require nanometer dimensions.

Ultimate Pn Junction

With the present invention, a single-dopant pn junction is created by depositing a donor and an acceptor atom at precise locations on the surface of or within a solid host matrix or lattice. This host structure, H, may embody a variety of shapes and textures. The host structure, H, and the active cell can be thought of as a supermolecular structure. To aid understanding, this system can be conceptualized like other complex quasi-macromolecular structures, such as proteins or chromosomes.

Figure 4:
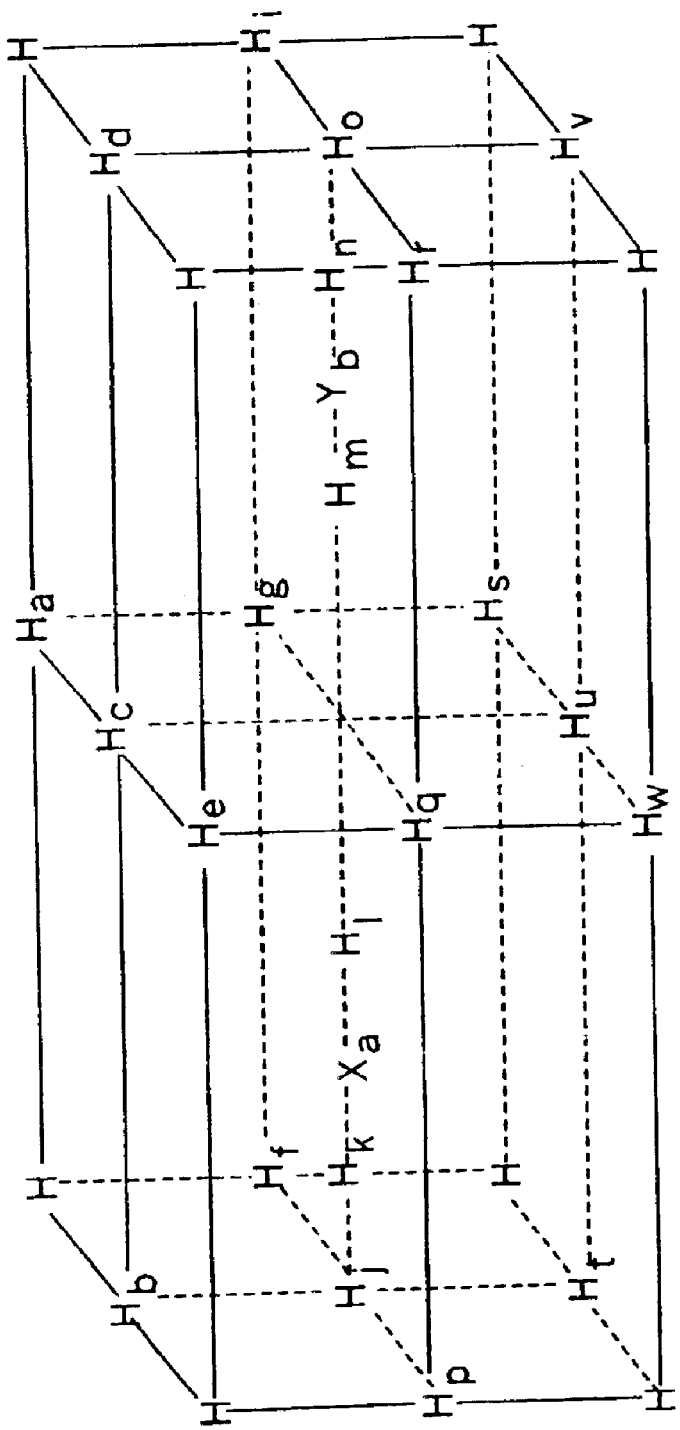
FIG. 4 illustrates a rectangular cubic host cell supermolecular structure with a pn junction.

Consider the case of a rectangular cubic cell, $H_{cubic}$. From the perspective of a supermolecular structure, this cell is represented in FIG. 4. Note that the subscripts of H specify the number of host elements that connect the terminus host elements in the solid structure, H. The example of FIG. 4 shows a type of diagram that helps define the precise positions of the constituent atoms in the supermolecular structure. In FIG. 4, H is the host matrix or lattice element, where the subscript corresponds to the number of host elements in the chain connecting the terminus elements in the solid structure. $X_a$ is a dopant atom embedded in a local environment, such that the dopant can either be an electron acceptor or an electron donor. Also, this dopant may be attached, or in close proximity to, a modifying substituant, R, such that $X_a$=Dopant+R. $Y_b$ is a dopant atom, that complements $X_a$, embedded in a local environment, such that the dopant, $Y_b$, can either be an electron acceptor or an electron donor. Also, this dopant may be attached or in close proximity to a modifying substituent, R, such that $Y_b$=Dopant+R. Note that the substituent, R, may differ for each dopant.

For the specific case of donors, D, and acceptors, A, the empirical formula for such a supermolecular pn-junction type structure would be, $H_xD_1A_1$, such that, X equals the total number of host atoms in the structure, D and A equals the two complementary dopant atoms. The positions of, and distances between dopants are accurately and precisely controlled. For a regular polyhedral structure such, as $H_{cubic}$, the X coefficient would be defined as: X=[a+2]*[b+2]*[p+2]-2, where a+2, b+2, and p+2 correspond to the numbers of H atoms on a side. Alternatively, for a silicon cube with L nanometers on a side, the expression for the X coefficient is approximately $X=50*L^3$.

Figure 1:
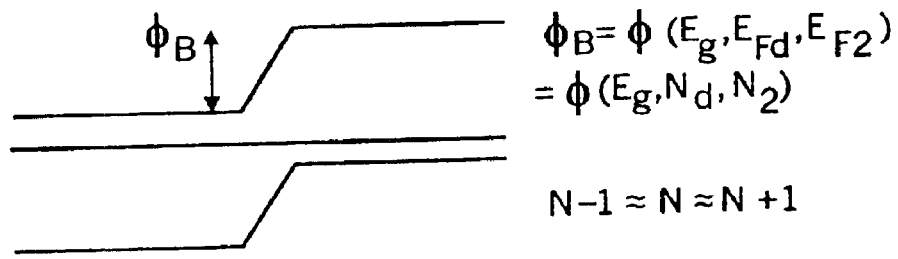
FIG. 1 illustrates the barrier height as a function of band gap and Fermi level in a prior art semiconductor device.
Figure 5:
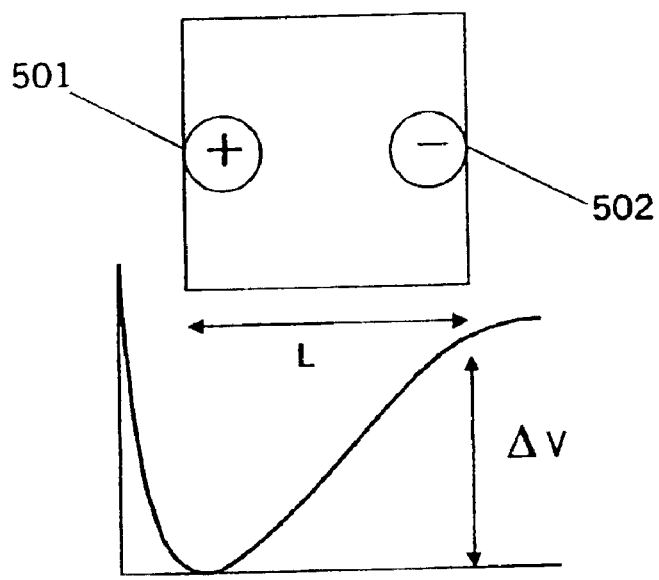
FIG. 5 illustrates how charge separation determines barrier height in a pn junction device like that shown in FIG. 4
Figure 6:
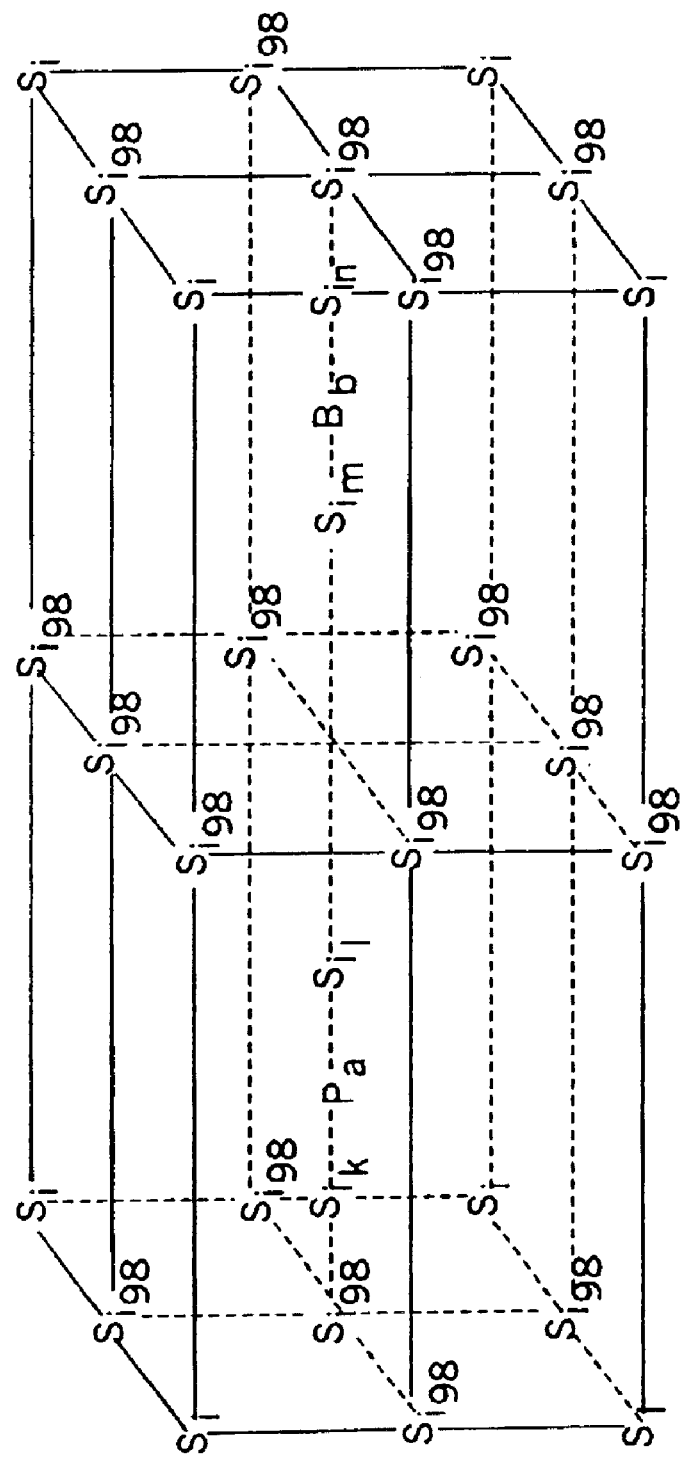
FIG. 6 is a more specific example of a structure as shown in FIG. 4 with a dimension of 100 atoms on a side.

Now, consider a specific single dopant pn-junction, such as a phosphorus atom, $P_a$, and a boron atom, $B_b$, attached to opposite sides of a silicon cube, as schematically shown in FIG. 6. Such attachments can be made, for example, using proximity probe technology. This represents an ultimate pn-junction consisting of 1 donor and 1 acceptor atom. The macroscopic analogues of this system are conventional pn-junction devices and compensated semiconductors, as discussed in relationship to FIG. 1. At equilibrium, charge transfer has occurred and both dopants are ionized. There exists a one-to-one correlation between the electron provided by the donor and the electron captured by the acceptor. In this way, the donor and the acceptor create a unique dipole within this structure. As shown in FIG. 5 for donor 502 and acceptor 501, the barrier height of such an ultimate pn-junction is determined primarily by the charge separation d, which in this case is close to the cube linear dimension, L. The host environment provides a medium that also will effect the charge transfer and properties of the dopants and dipole. The addition of an extra charge will completely change the potential of the system.

In the example of FIG. 6, a single charge pn-junction is embedded in a cube of silicon, with dimension of 100 atoms on a side. A general empirical formula for this specific family of systems would be $Si_{-999998}P_1B_1$ or $Si_{-999998}D_1A_1$ for the general case of donors, D, and acceptors, A. This empirical formula does not completely define the structure, as it does not provide any information about the precise locations of the dopants within this cell.

The example discussed above represents one class of generally shaped features that may be considered to be a rectangular cubic, $H_{cubic}$. The cubic has a single donor atom positioned such that it resides in the center of one side of a host structure, mass, or cell, of semiconductor material, $H_{cubic}$, and a single acceptor atom at a second, opposing side, at a specified distance from the donor atom. This distance may be defined by counting atoms in the supporting lattice or by other means. The single donor and acceptor atoms are positioned so that a single dipole is created within the host structure, $H_{cubic}$. A pn junction device can be made from a cell as described here by building the mass, H, on a substrate and attaching contact electrodes. The properties of this device will be controlled by several factors, such as: the identity of dopants; the distance between and position of dopants; the composition and structure of the host matrix or lattice; the composition and structure of the local environment around the dopant atoms; the composition and structure of the environment around the host structure; and the nature of the interface with the outside world —electron or wireless interconnects, etc. The properties are also controlled by whether the dopant is embedded in the host molecule or a substituent is attached and/or placed in close proximity to the dopant.

Ultimate Bipolar Structure

The addition of one additional donor or acceptor to this ultimate pn-junction creates the ultimate bipolar structure or single-dopant bipolar cell (SDBC). For this bipolar cell, a pair of atoms, both either donor or acceptor atoms, reside at or are buried within opposing sides of the host structure. A single atom is placed between the atoms of the pair. If the atoms in the pair are donors, the single central atom is an acceptor. If the atoms in the pair are acceptors, the single atom between them is a donor. The atoms are all positioned so that two asymmetrical potential wells, separated by a barrier, are formed within the semiconductor. The bipolar cell can be made into a stand-alone device by adding an insulating substrate and contact electrodes. This device either can function as a bistable device or an oscillator, depending on operating temperature, as will be discussed later. The host structure, H, and active cell can again be thought of as a supermolecular structure. To aid understanding, this system can be conceptualized like other complex quasi-macromolecular structures, such as proteins or chromosomes.

Figure 7:
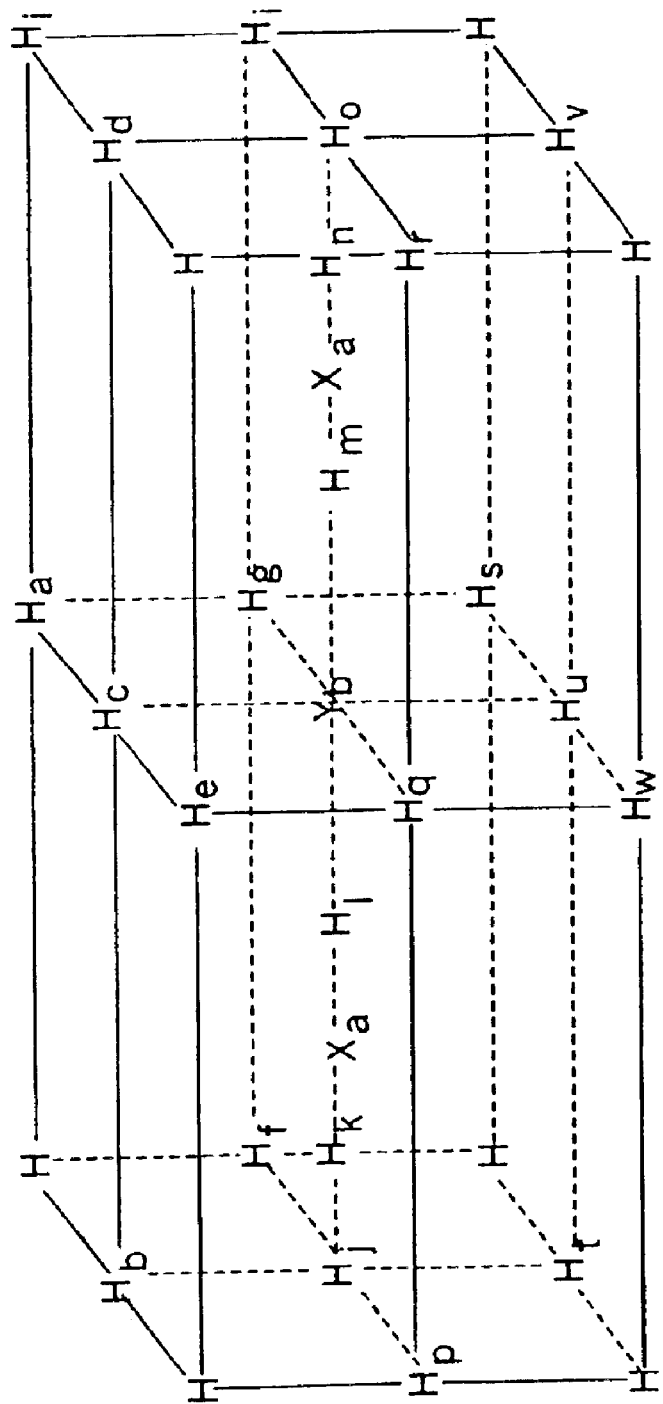
FIG. 7 is an example of an ultimate supermolecular bipolar cell.

Consider, once again, the simple case of a rectangular cubic cell, $H_{cubic}$. From the perspective of a supermolecular structure, this cell may be pictorially represented as shown in FIG. 7 where H is the host matrix or lattice element, previously defined; and $X_a$ is a dopant atom embedded in a local environment, such that the dopant can either be an electron acceptor or an electron donor. Also, this dopant may be attached or in close proximity to a modifying substituent, R, such that $X_a$=Dopant+R. In FIG. 7, $Y_b$ is a dopant atom, that complements $X_a$, embedded in a local environment, such that the dopant, $Y_b$, can either be an electron acceptor or an electron donor. Also, this dopant may be attached or in close proximity to a modifying substituent, R, such that $Y_b$=Dopant+R. Note that the substituent, R, may differ for each dopant.

Figure 8:
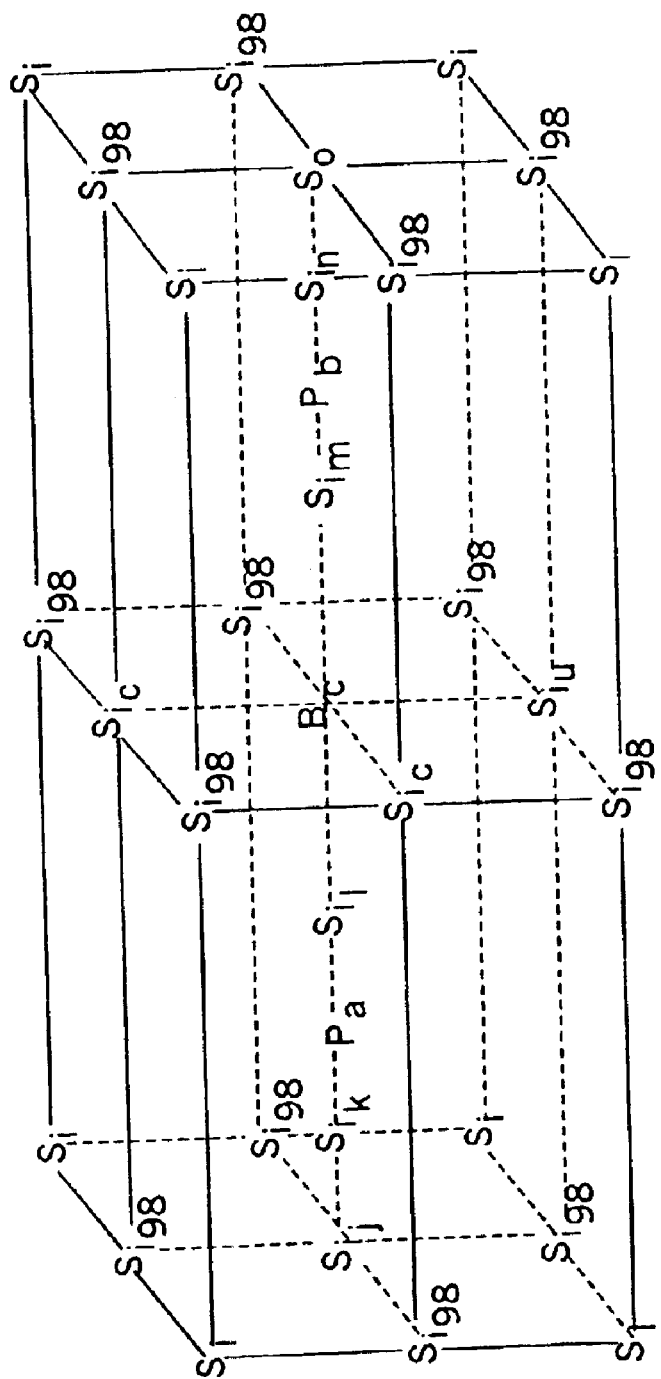
FIG. 8 illustrates a specific example of an ultimate silicon bipolar structure according to the invention.

The specific case of a silicon cube, with dimensions of 100 atoms per side, containing two phosphorous atoms, $P_b$, as donors and one boron atom, $B_c$, as an acceptor, is shown in FIG. 8. A general empirical formula for this specific family of systems would be $Si_{-999997}P_2B_1$ or $Si_{-999997}D_2A_1$ for the general case of donors, D, and acceptors, A. This empirical formula does not completely define the structure, as it does not provide any information about the precise locations and positioning of the dopants within this cell.

Figure 9:
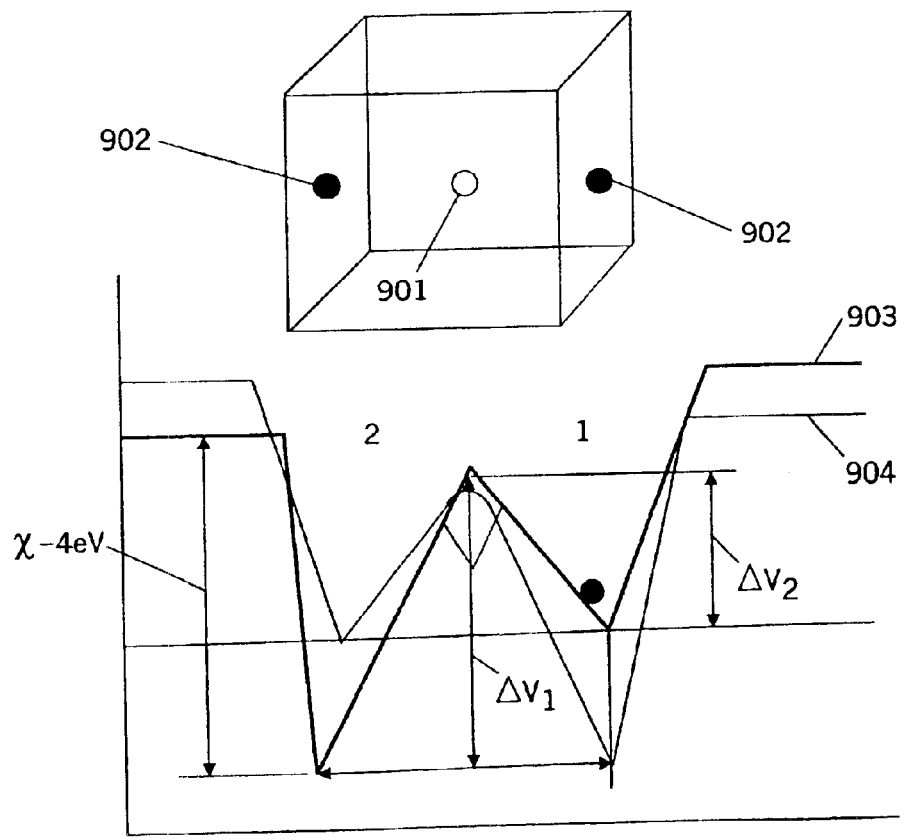
FIG. 9 illustrates potential wells formed in the bipolar cell according to the invention.

From a first order perspective, the SDBC, as shown in FIG. 9, forms two asymmetrical potential wells separated by a barrier. The potential of the cell is determined by two positive fixed charges, from donors 902, one negative fixed charge from acceptor 901, and one movable negative charge. In this system, the acceptor does not bind the second electron. The movable electron can be either in the well 1 or the well 2. Excluding designed local host environmental effects, the barrier height from the well with the free electron is twice as high as the barrier height from the other side. Curves 904 and 905 illustrate the barrier height dependence. As the electron moves from well 1 into well 2, the potential distribution switches from 905 to 904 as shown in FIG. 9. In an analogous manner, the cell could be built from two acceptors and one donor. The properties and behavior of this system depends on the potential distributions shown in curve 1301 of FIG. 13.

The SDBC will exhibit two general modes of operation, depending upon the ambient temperature:

1) At $T<T_{th}$, the system exists as a bistable device;
2) At $T>$ or $=T_{th}$, the system can exhibit self-powered behavior and oscillations will occur spontaneously.

(T is the ambient temperature and $T_{th}$ is threshold temperature for spontaneous oscillations, see FIG. 10). Note that the ambient temperature in all cases can be the passive temperature of the environment, eg. air, ground, or water temperature, or can be actively controlled such as by heating or cooling.

The oscillation period, frequency, and power in the second case are, respectively:

$\theta \sim 1/e \ (2\pi\epsilon_0 \epsilon m_e L^3)^{1/2}$ $f \sim 1/\tau$ $P \sim e \ \Delta V_1 / \tau$ ($\tau$ is oscillation period, f is oscillation frequency, P is power of oscillations, e– is elementary charge, $m_e$ is electron mass, L is size of SDBC, $\epsilon_0$ is permittivity in vacuum, and $\epsilon$ is the dielectric constant of the semiconductor.)

FIG. 10 illustrates threshold temperature and other parameters as a function of cell size, L. At or above the threshold temperature, $T_{th}$, oscillations occur spontaneously. As the oscillations continue, heat is removed from the system. In this mode, energy is converted from thermal energy to electromagnetic radiation. Maintaining these oscillations requires a permanent source of heat to power the system. The inverse process of converting electromagnet radiation into thermal energy can also be realized. Parameters of the oscillator as function of the cell size L are shown in FIG. 11.

Figure 12:
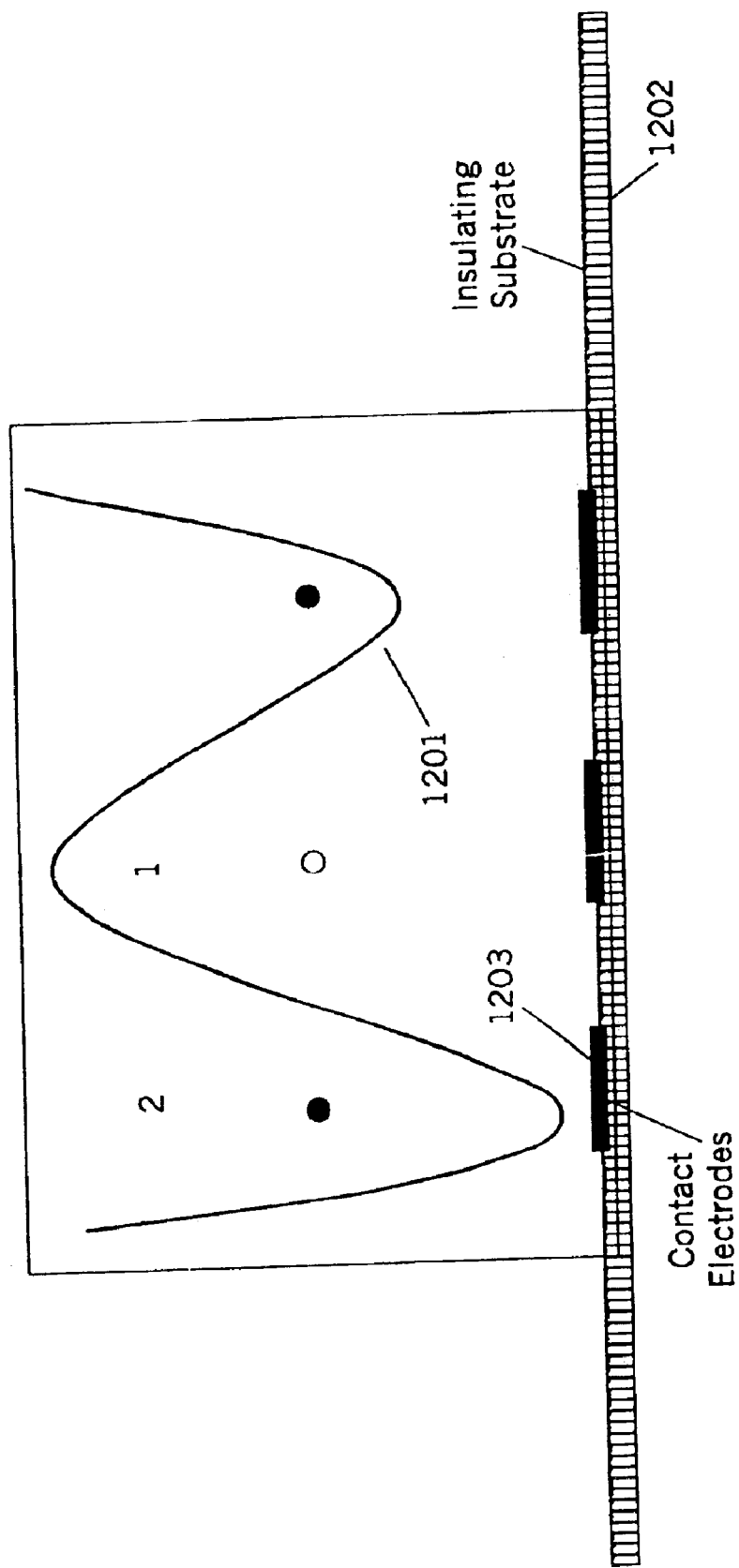
FIG. 12 illustrates a two-state bipolar cell which forms a stand-alone device, and also shows the potential distribution inside the device.
Figure 13:
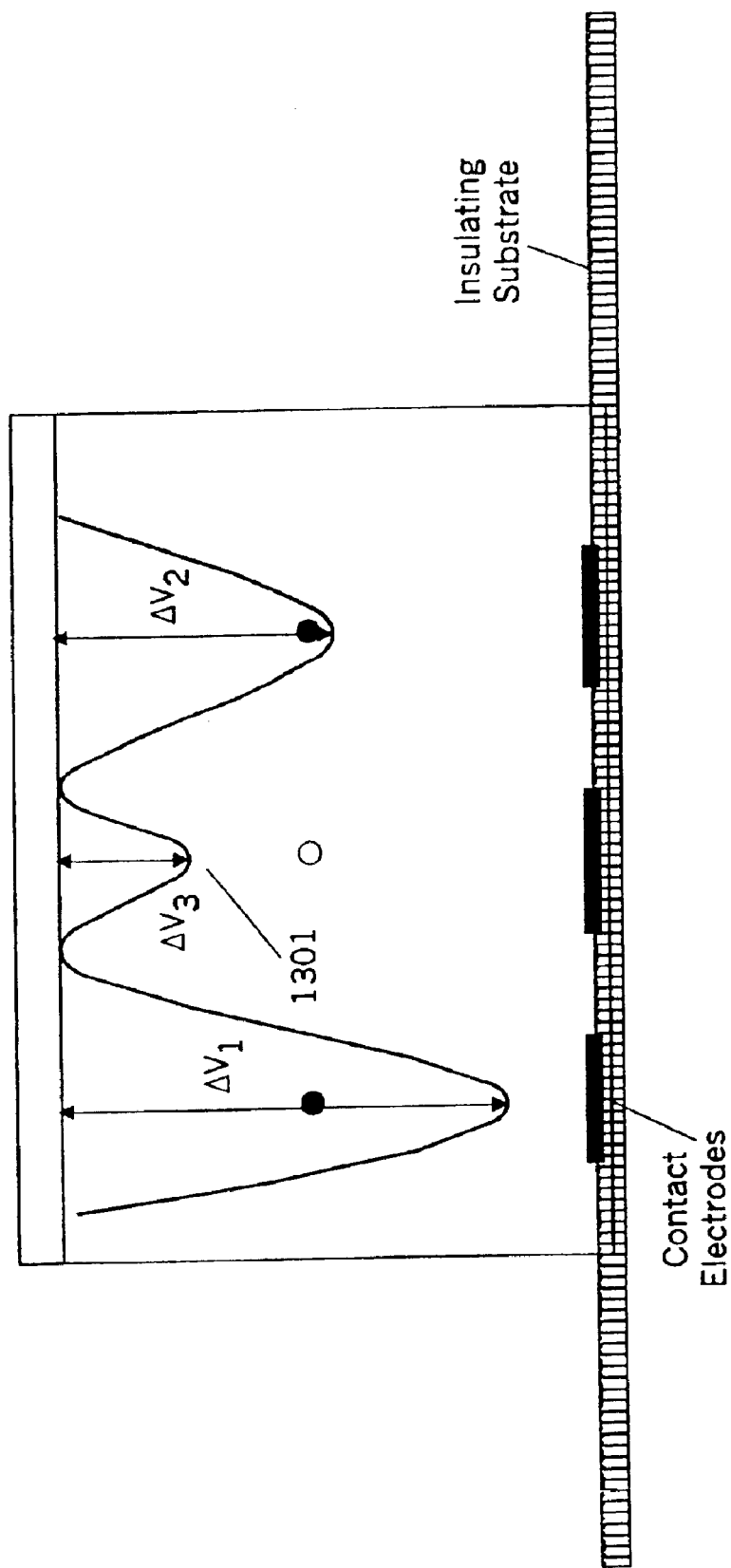
FIG. 13 illustrates a three-state bipolar cell which forms a stand-alone device, and also shows the potential distribution inside the device.

FIG. 12 illustrates a stand-alone bipolar device according to the invention. The device includes an insulating substrate 1202 and contact electrodes 1203. Potential curve 1201 illustrates the potential wells of the two states of the device which cause bistable or oscillatory behavior. FIG. 13 illustrates an extension of the two-state device to a three-state device, where the potential distribution, 1301, comprehends three potential wells. The depths of the potential wells $\Delta V_1$, $\Delta V_2$, and $\Delta V_3$ are functions of the local atomic level 'chemical' environment about each dopant atom. This device also will exhibit oscillatory behavior by tuning the potential threshold about each dopant atom.

The above principles can be applied in general to any semiconductor or related host material. The numerical analysis was performed for silicon. However, many other materials can be used, such as, but not limited to, nanodiamond, nanotubes, and other organic, inorganic, and organometallic semiconducting systems.

Figure 15:
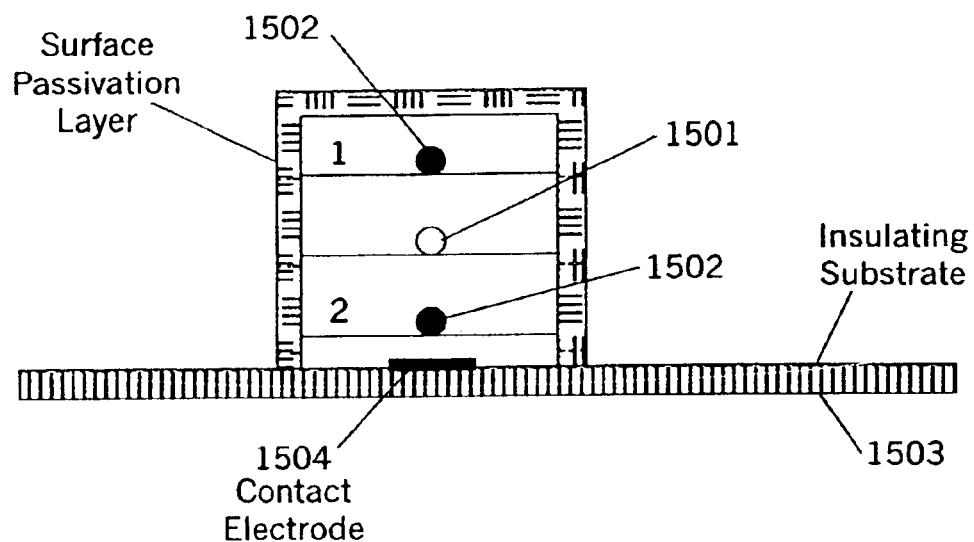
FIG. 15 illustrates a vertical single-dopant bipolar cell according to the invention.

An SDBC can be fabricated either horizontally or vertically, relative to an initial substrate. The vertical structure of FIG. 15 can be fabricated by controlled layer-by-layer growth on an insulating substrate 1503, for example with molecular beam epitaxy (MBE) technology. Such a structure is more feasible from the view of both fabrication and operation than horizontal structures. For an oscillator like that discussed in relation to FIG. 11, the dopants, 1501 and 1502 are completely embedded in the matrix and the surface is passivated, resulting in the passivation layer shown. Contact electrodes as shown at 1504 complete the device.

While the fabrication of the vertical device is simpler, the vertical structure allows for only one contact to the bottom electrode as compared to the horizontal structure. Also, the vertical structure is not suitable for long coherent oscillator arrays, as discussed below. However, short vertical arrays can be made over a distance of a few microns.

It should be noted that other combinations of dopants allow for a diversity of potential distributions and therefore more opportunities for device realization. For example, unlike structures with large numbers of dopants, the single dopant n-p-n and pn-p structures have quite different potential distribution. Both n-p-n and p-n-p structures allow for delocalized charges. The "flip-flop" transitions for the p-n-p system may require a two step mechanism. However, the n-p-n system switches via a more concerted process. In the latter case, the system will tend to exist in one of the following states: $n^+$-$p^-$-$n^0$ or $n^0$-$p^-$-$n^+$. One state can flow directly into the other by a simple one step shift of the electrons associated with $p^-$ and $n^0$ towards the $n^+$species. Unlike the n-p-n case, the p-n-p system can exist in following three distinct states: a) $p^0$-$n^+$-$p^-$, b) $p^0$-$n^0$-$p^0$, and c) $p^-$-$n^+$-$p^0$. The transformation from state "a" to state "c" requires a two step mechanism that passes the intermediate state "b", as the movement of a single electron is responsible for effecting each of these discrete states. Hence, the properties of the p-n-p system can be tuned by controlling the local atomic environment and structure about the central "n" moiety. Shown below is one example that facilitates tuning or attenuation of the oscillator.

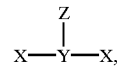

In this configuration, Z represents the moiety that tunes the environment and potential about Y. Other devices, with unique properties, can be made by precisely positioning additional individual dopant atoms in close proximity to the other dopants. In this way, an integrated circuit based on the precise arrangement of atoms can be designed.

Practical Applications

Figure 14:
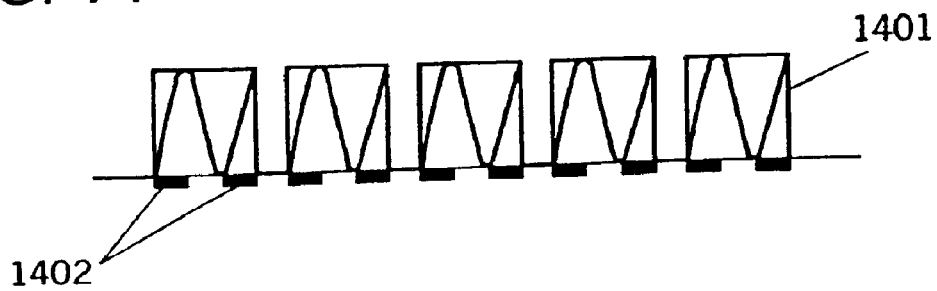
FIG. 14 illustrates a single charge oscillator array which forms a coherent oscillator according to the invention.

A linear array of single dopant bipolar cells, as shown in FIG. 14, will experience coherent oscillations. Phase oscillations spontaneously induced in individual cells, 1401, are random at first but eventually transform to in-phase (coherent) oscillations due to electrostatic coupling between the cells. Parameters of the oscillator array can be determined from the table of FIG. 11.

This array can be used to make a semiconductor oscillator since coherent oscillations will result if the array is maintained at a temperature equal to or greater than the threshold temperature. An oscillator device is made from the array built on an insulating substrate. Contact electrodes are connected to the array as a means of connecting the device to external circuitry and a thermal or other energy supply system is included to maintain the proper operating temperature of the array. The electrodes may operate via electronic, charge coupled, or photonic means. Another function of the contact electrodes is to control the emergence of oscillations. If positive bias is applied to contact electrodes, the electrons will be 'frozen' in the cells. Thus, the transition from bistable to oscillating cell at a given temperature can be controlled by external bias.

Figure 16:
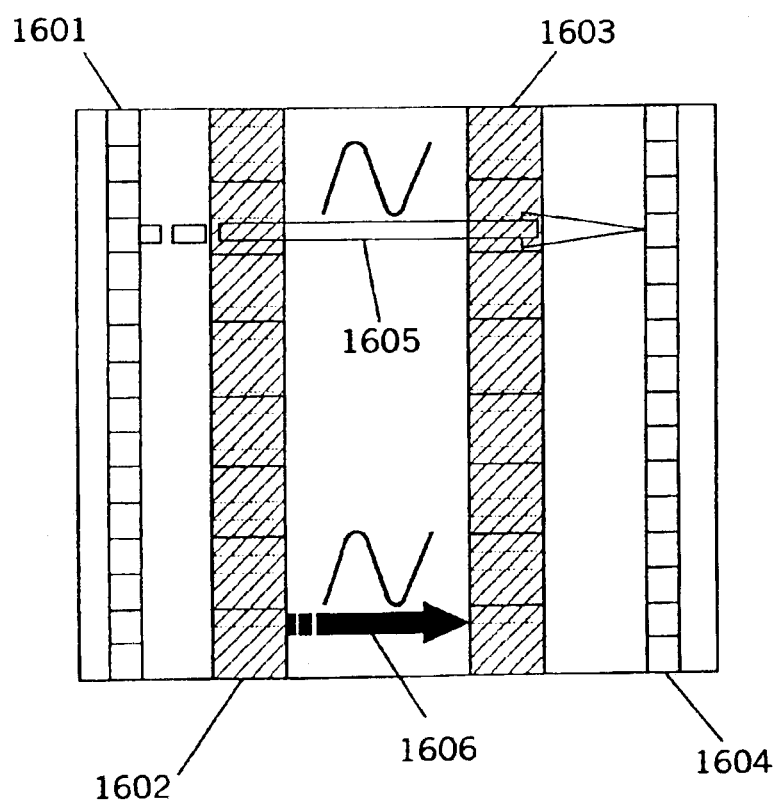
FIG. 16 illustrates a microwave interconnect which makes use of the present invention.

Single charge oscillator arrays (SCOA) offer an elegant solution to an interconnect problem common with radio frequency (RF) devices. FIG. 16 illustrates an RF interconnect using single charge oscillator arrays. The transmitter (1601, 1602), and receiver (1603, 1604) are SCOA's of identical cell size. The oscillations in the transmitter SCOA selectively induce oscillations in the receiver SCOA. The selectivity of transmission lines (1605 and 1606) is determined by the size-specificity of oscillation. Transmitter-receiver (T-R) pairs of common cell size, that differ from other T-R pairs in cell size only, allow for parallel connections or transmission lines (1605 and 1606 in FIG. 16). The oscillations in the transmitter SCOA can be suspended or released by applying control commands to underlying contacts (1402 in FIG. 14).

Oscillator arrays that use the invention can also be used to make self-powered devices. A specific feature of the proposed oscillator array is that, under the right conditions, its operation does not require an external supply of electric energy. Instead, oscillations occur spontaneously at a certain temperature, as defined by the structural specifications of the system. The oscillator array is powered by thermal energy and will continue to function, as long as a certain minimum temperature is maintained. Thermodynamically, this situation resembles hurricane formation (coherent oscillation/perturbation) over an ocean surface when the ocean temperature is increased by only few degrees above the normal temperature. For example, a two to three degree increase in ocean temperature is enough to convert the thermal energy of the ocean into the disruptive mechanical energy of the hurricane. As can be seen from the table in FIG. 10, at or near ambient temperatures, device oscillations with reasonable power density ($\sim$W/cm$^2$) will occur for cell sizes below 50 nm. The oscillator array can be used for transmitting signals. Also, this device can convert microwave power along the circuit into electric DC power, by a simple rectification process. Thus, in addition to signal T-R pairs in the interconnect above, it is possible to make power T-R pairs. The power varies with array length. In principle, this approach allows for the elimination of an external electric power supply, at least for low power applications, provided any suitable source of heat provides power to the circuit, as specified in FIG. 11.

This self-power capability can be used in electronic circuits as well as in numerous other applications, such as, but not limited to, "smart skins". In this system, the threshold energy is so low that it could be powered by being in contact with or in close proximity to a living body. The energy of this ambient environment is sufficient to power this system. The capability also allows the arrays to be used as energy converters. Macroscopic single charge oscillator arrays, SCOA, can be used for general energetic purposes. Additionally, a device could be designed with a threshold so low that it could be powered by the temperature of the ambient environment. Those skilled in the art will appreciate that there are many possible devices and applications by controlling the concentration, position, and environment of single dopant atoms within a suitable material.

Fabrication Techniques

Many manufacturing methods can be used to make single-dopant cells according to the invention. The size and shape of individual host cell structures, H, are defined by submicron and nanoscale patterning. Techniques for fabricating patterned cells include, but are not limited to: lithography, both conventional and so-called "next generation lithography" (NGL); maskless patterning; imprint or 'step and flash' patterning or self assembly; and thin film or interface deposition by chemical vapor deposition (CVD), molecular beam epitaxy (MBE) or atomic layer epitaxy (ALE). The precise positional assembly of individual dopant atoms can be achieved by proximity probe manipulation of individual atoms at low temperatures. The fixing of the atomic positions of dopants and suppression of their movement can be accomplished by topography or surface driven segregation of dopants and/or surface passivation, electron-irradiation modification of materials properties, or the use of porous materials with controlled shape and distribution of pores, such as porous polymers, porous diamond, and porous calcium fluoride.

For example, to construct the horizontal structure shown in FIG. 4, molecular beam epitaxy, MBE, can be used to build up a specified thickness of host material of a silicon lattice. Maskless patterning methods, such as probe lithography, are used to position individual dopant atoms at precise locations on the silicon surface at low temperatures MBE continues to build up the thickness of the silicon lattice and embed the dopants at precise locations within this structure. Holographic patterning methods can be used to define regions to etch, for isolating individual structures. Alternatively, the final etch, a subtractive process, can be eliminated if an MBE resistant region is defined lithographically prior to the first step, listed above. In a similar way, dopant atoms can be arranged colinearly, in a vertical manner, by alternating the MBE and maskless patterning steps described above, until the three dopant atoms are positioned. Final MBE and holographic patterning complete the fabrication of this vertical cell.

A method of making an atomic chain circuit by placing atoms at predetermined locations is described in U.S. Pat. No. 5,981,316, issued Nov. 9, 1999, which is incorporated herein by reference. That method is based on recent progress in atom manipulation technology that allows a fabricator to move atoms one by one and arrange them as desired using a proximity probe manipulation (PPM) technique.

The same technique can be used to make semiconductor structures according to the invention. For simple prototyping, commercially available proximity probe systems can be used. However, a more efficient way of using PPM for mass production is shown in FIG. 17. In FIG. 17, SDBC's are made by placing three dopant atoms in a line with fixed separations in between. A cantilever 1704 supports a 3-probe PPM system. Bound probes 1702 place one type of atom, and bound probe 1703 places another. This system enables "stamping" arrays of identical sets of 3 dopants at a substrate, 1701. Carbon nanotube-based probes are preferable for this sort of application. Addressable multiprobe arrays further extend this fabrication concept towards high-yield production.

Figure 18A:
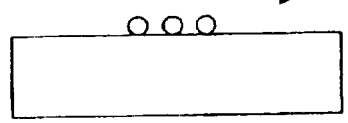
FIG. 18 illustrates the fabrication process of horizontal single-dopant bipolar cells according to the invention.
Figure 18B:
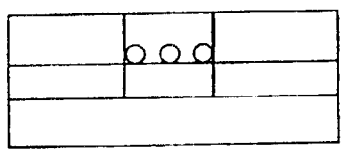
Figure 18C:
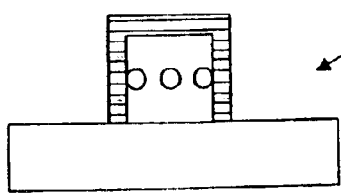
Figure 19A:
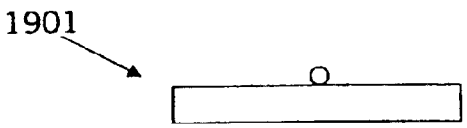
FIG. 19 illustrates the fabrication process of vertical single-dopant bipolar cells according to the invention.
Figure 19B:
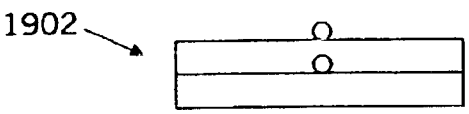
Figure 19C:
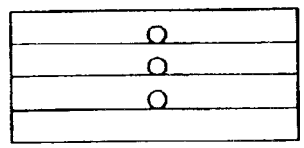
Figure 19D:
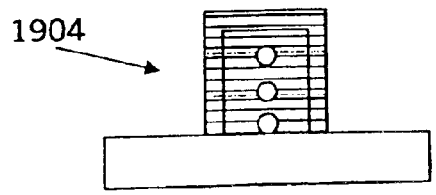

A horizontal, silicon-based SDBC is fabricated with the system in FIG. 17 as shown in FIG. 18 according to the following method. First, 3-atom sets of dopants are placed at a silicon (Si) substrate by PPM technique, as shown at 1801. An epitaxial film of Si is grown by low temperature MBE (LT MBE) or low temperature CVD (LT CVD). The film thickness is half of the cell size. The resulting structure is shown at 1802. Patterns (e.g. squares) are produced at the surface by any nanolithographic technique, and the cell shape is defined by dry etching. The surface of the cell is passivated by few monolayers of SiO$_2$, hydrogen, or CaF$_2$, as shown by cross-hatching. The structure 1803, shown in FIG. 18, results.

FIG. 19 illustrates the fabrication of a vertical, silicon-based SDBC. In this case, one or two probes place the atoms, as they are not placed in sets of three. A first dopant atom is placed at the Si substrate as shown at 1901. An epitaxial film of Si is then grown by LT MBE, the epitaxial film having a thickness of one third of the cell size. A second dopant is place atop the structure as shown at 1902. The second dopant atom is placed at exactly the same horizontal spatial coordinate as the first dopant atom. Another epitaxial Si film is grown over the second dopant atom. A third dopant atom is placed on the structure. Again, the horizontal spatial coordinate for this atom is the same as for the first two atoms. Another epitaxial film is grown resulting in structure 1903. All epitaxial films are equal to one third the desired cell size. Finally, patterns (e.g. squares) are produced at the surface by any nanolithographic technique, and the cell shape is defined by dry etching. The surface of the cell is again passivated by few monolayers of SiO$_2$, hydrogen, or CaF$_2$, as shown by cross-hatching, and the structure 1904 results.

We have described specific embodiments of our invention, which provides supermolecular structures and devices based on those structures. One of ordinary skill in the semiconductor, chemical, and/or electronics arts will quickly recognize that the invention has numerous other embodiments. In fact, many implementations are possible. The following claims are in no way intended to limit the scope of the invention to the specific embodiments described.

We claim:

1. A supermolecular structure comprising:

a host material; and impurities comprising component atoms of at least a first type and a second type such that the positions of the component atoms are substantially fixed, at least in part by controlled placement on a surface, to impart substantially predictable single-charge properties to the structure, the structure also being described by the formula:

$$H_A \Sigma X_{ia}$$

wherein:

H defines the host material;

A is a number representing the number of host atoms in the structure;

X defines the $i^{th}$ impurity; and a defines the quantity of the $i^{th}$ impurity.

2. A single charge oscillator array comprising a plurality of electrostatically coupled supermolecular structures, each structure further comprising:

a host material; and impurities comprising component atoms of at least a first type and a second type such that the positions of component atoms are substantially fixed, at least in part by controlled placement on a surface, to impart substantially predictable properties to the structure, each structure also being described by the formula:

$$H_A \Sigma X_{ia}$$

wherein:

H defines the host material;

A is a number representing the number of host atoms in the structure;

X defines the $i^{th}$ impurity; and a defines the quantity of the $i^{th}$ impurity.

3. A semiconductor oscillator comprising:

an insulating substrate;

a single charge oscillator array disposed upon the insulating substrate, the single charge oscillator array further comprising a plurality of electrostatically coupled host structures comprising single-charge impurity atoms of at least a first type and a second type, each single-charge impurity atom have been positioned at least in part by controlled placement on a surface;

contact electrodes connected to the array; and a thermal energy supply system for maintaining an operating temperature of the array at least as high as a threshold temperature.

4. The semiconductor oscillator of claim 3 wherein each host structure can be described by the formula:

$$H_A \Sigma X_{ia}$$

wherein:

H defines the host material;

A is a number representing the number of host atoms in the structure;

X defines the $i^{th}$ impurity; and a defines the quantity of the $i^{th}$ impurity.

5. Apparatus for supplying oscillations comprising:

means for supplying thermal energy to maintain an operating temperature of the apparatus at least as high as a threshold temperature;

means for generating coherent oscillations in response to the thermal energy, the means for generating further comprising a plurality of electrostatically coupled host structures comprising single-charge impurity atoms of at least a first type and a second type, each single charge impurity atom have been positioned at least in part by controlled placement on a surface;

means for insulating and supporting the means for generating; and means for connecting the apparatus to external circuitry, the means for connecting connected to the means for generating.

* * * * *